United States Patent
Saxena et al.

(10) Patent No.: US 9,655,232 B2
(45) Date of Patent: May 16, 2017

(54) SPANNING TREE PROTOCOL (STP) OPTIMIZATION TECHNIQUES

(71) Applicant: Cisco Technology, Inc., San Jose, CA (US)

(72) Inventors: Abhishek Saxena, San Jose, CA (US); Ramana Mellacheruvu, Cupertino, CA (US); Parag Deshpande, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 290 days.

(21) Appl. No.: 14/459,085

(22) Filed: Aug. 13, 2014

(65) Prior Publication Data

US 2015/0124655 A1    May 7, 2015

Related U.S. Application Data

(60) Provisional application No. 61/900,378, filed on Nov. 5, 2013.

(51) Int. Cl.

| | |
|---|---|
| *H04L 12/26* | (2006.01) |
| *H05K 1/02* | (2006.01) |
| *H04L 12/24* | (2006.01) |
| *H04L 12/753* | (2013.01) |
| *H04L 12/705* | (2013.01) |
| *G06F 1/16* | (2006.01) |
| *H05K 1/11* | (2006.01) |

(52) U.S. Cl.
CPC ............ *H05K 1/0245* (2013.01); *G06F 1/16* (2013.01); *H04L 41/0803* (2013.01); *H04L 45/18* (2013.01); *H04L 45/48* (2013.01); *H05K 1/0216* (2013.01); *H05K 1/115* (2013.01); *Y02B 60/43* (2013.01)

(58) Field of Classification Search
CPC ............................ H04L 41/0886; H04L 41/12
See application file for complete search history.

(56) References Cited

U.S. PATENT DOCUMENTS

| | | | |
|---|---|---|---|
| 5,801,597 | A | 9/1998 | Carter et al. |
| 6,388,208 | B1 | 5/2002 | Kiani et al. |
| 6,486,405 | B2 | 11/2002 | Lin |
| 6,952,421 | B1 * | 10/2005 | Slater ...................... H04L 45/00 370/401 |
| 7,002,430 | B2 | 2/2006 | Benham et al. |
| 7,232,959 | B2 | 6/2007 | Hsu |
| 7,249,337 | B2 | 7/2007 | Gisin et al. |
| 7,397,320 | B1 | 7/2008 | Bokhari |

(Continued)

*Primary Examiner* — Kevin C Harper
(74) *Attorney, Agent, or Firm* — Polsinelli LLP

(57) ABSTRACT

Systems and approaches are provided for optimizing the Spanning Tree Protocol (STP) in a switched network. STP port type for a network infrastructure device can be controlled based on the dynamically discovered neighbor device type of the directly connected peer of the device using the Link Level Discovery Protocol (LLDP). LLDP can provide system capabilities of a link level peer to identify whether the link level peer is a host or a network infrastructure device. In various embodiments, the exchange of system capabilities can the trigger the configuration of an STP port as a network port for ports connected to network infrastructure devices or edge ports for ports directly connected to host devices.

20 Claims, 7 Drawing Sheets

(56) References Cited

U.S. PATENT DOCUMENTS

| | | | |
|---|---|---|---|
| 7,411,915 B1* | 8/2008 | Spain | H04L 41/0806 370/250 |
| 7,448,880 B2 | 11/2008 | Osaka | |
| 7,729,296 B1* | 6/2010 | Choudhary | H04L 12/4625 370/256 |
| 8,283,991 B1 | 10/2012 | Essenwanger | |
| 8,624,688 B2 | 1/2014 | Essenwanger | |
| 9,433,081 B1 | 8/2016 | Xiong et al. | |
| 2008/0310421 A1* | 12/2008 | Teisberg | H04L 12/4641 370/395.53 |
| 2011/0203843 A1 | 8/2011 | Kushta | |
| 2013/0162364 A1 | 6/2013 | Lin | |
| 2014/0236512 A1 | 8/2014 | Yan | |

* cited by examiner

900

902

System Capabilities Information from a Link Level Peer is Received.

904

A Device Type of Link Level Peer is Determined.

906

A STP Port Type is Configured for the Port Based on the Determined Device Type.

FIG. 9

SPANNING TREE PROTOCOL (STP) OPTIMIZATION TECHNIQUES

RELATED APPLICATIONS

This application claims priority to U.S. Provisional Patent Application No. 61/900,378, filed Nov. 5, 2013, the content of which is incorporated herein by reference in its entirety.

TECHNICAL FIELD

The present technology pertains to computer networking management, and more specifically pertains to the Spanning Tree Protocol (STP) in a switched network.

BACKGROUND

STP is a link management protocol that can provide path redundancy while preventing loops in a network. For a conventional network, such as an Ethernet network, only one active path can exist between any two nodes for the network to function properly. If a loop were to form in the network, the amount of traffic that could be passed between infrastructure devices (e.g., switches, bridges, relays, among others) can quickly utilize the entire bandwidth available within each of the devices affected.

STP is compliant with IEEE 802.1D, entitled "Media Access Control (MAC) Bridges," and which is incorporated herein by reference. STP can use a Spanning-Tree Algorithm (STA) to calculate an optimal loop-free path throughout a switched network by defining a tree with a root bridge and a loop-free path from the root to all infrastructure devices in the network. STP can force redundant data paths into a standby (blocked) state to create redundancy but not loops. If a network segment in the spanning tree fails and a redundant path exists, the STA can recalculate the spanning tree topology and activate the standby path. Infrastructure devices send and receive STP frames, called bridge protocol data units (BDPUs), at regular intervals. The devices do not forward these frames, but can use the frames to construct a loop-free path.

When two interfaces on a bridge are part of a loop, the STP port priority and path cost settings can determine which interface is put in the forwarding state and which is put in the blocking state. The port priority value can represent the location of an interface in the network topology and how well it is located to pass traffic. The STP path cost value can represent media speed.

The amount of computing resources utilized by STP, such as CPU, memory, and input/output (I/O), can be generally proportional to the product of the number of ports and the number of virtual LANs (VLANs) enabled on each port. With the proliferation of high port density switches (e.g., layer 2 (L2) and layer 3 (L3) switches) and Virtual Ethernet Port Aggregator (VEPA) devices that enable each switch front panel port to be virtualized into many more customer usable physical ports, new systems and approaches are required to optimize STP to keep a network operating system scalable and efficient.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which:

FIG. 9 illustrates a flowchart for executing an optimized STP configuration in accordance with an exemplary embodiment is illustrated.

DESCRIPTION

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Overview: Disclosed are system, methods and non-transitory computer-readable storage media for optimizing the Spanning Tree Protocol (STP) in a switched network. STP port type can include "edge" or "network" ports. Edge ports are connected directly to hosts while network ports are connected to other network infrastructure devices, such as bridges, switches, relays, components thereof, among others. As edge ports are connected to host devices, edge ports may not need the full STP state machine required by network ports. For example, edge ports can be placed in a forwarding state without running through the entire STP state machine. In addition, the periodic BDPUs transmitted during operation of STP may not need to be sent to edge ports, which can further reduce resource utilization on the system. In various embodiments, STP port type for a network infrastructure device can be controlled based on the dynamically discovered neighbor device type of the directly connected peer of the device using the Link Level Discovery Protocol (LLDP). LLDP can provide system capabilities of a link level peer to identify whether the link level peer is a host or a network infrastructure device. In various embodiments, the exchange of system capabilities can serve as a trigger to configure an STP port as a network port for ports connected to network infrastructure devices or edge ports for ports directly connected to host devices.

The amount of computing resources utilized by STP, such as CPU, memory, and input/output (I/O), can be generally proportional to the product of the number of ports and the number of virtual LANs (VLANs) enabled on each port. With the proliferation of high port density switches (e.g., layer 2 (L2) and layer 3 (L3) switches) and Virtual Ethernet Port Aggregator (VEPA) devices that enable each switch front panel port to be virtualized into many more customer usable physical ports, new systems and approaches are required to optimize STP to keep a network operating system scalable and efficient. In addition, the need to properly configure those ports is also increasing. The disclosed technology addresses the need in the art for reducing the overhead associated with utilizing STP. By optimizing the STP process, ports can be dynamically set by discovering the directly coupled neighboring device and controlling the setting of the STP port type which can reduce resource utilization on the system.

Figure 1:
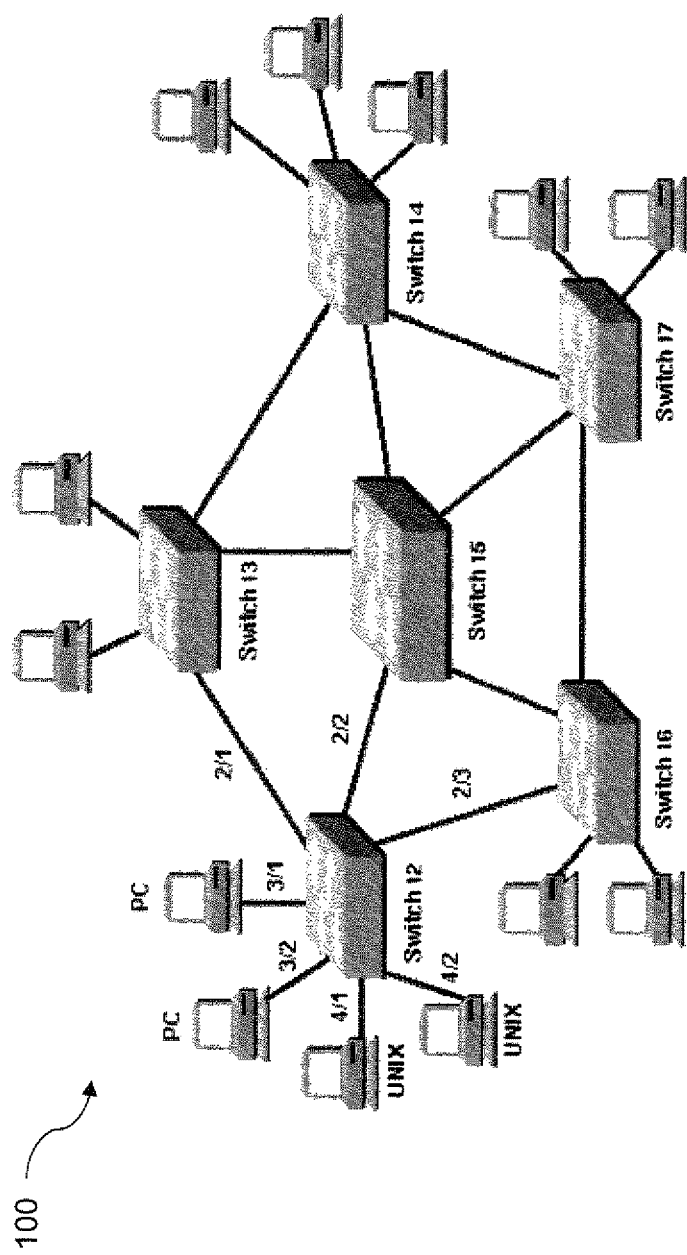
FIG. 1 illustrates a block diagram of a network having a plurality of switches in accordance with an exemplary embodiment.

Referring to FIG. 1, a block diagram of a network having a plurality of switches in accordance with an exemplary embodiment is illustrated. As shown, the network can include a switch 15 which can be a backbone switch. Switches 12, 13, 14, 16, and 17 can be switches that attach to workstations and PCs, as well as other network infrastructure devices. In this example, switch 12 includes port 2/1, which connects to switch 13; port 2/2, which connects to switch 15, port 2/3, which connects to switch 16; ports 3/1 and 3/2, which connect to personal computers (PCs); and ports 4/1 and 4/2, which connect to UNIX® workstations.

STP can run on network infrastructure devices that are 802.1D-compliant. STP can be implemented on such devices in order to prevent loops in the network. STP can be used in situations where redundant links, but not loops, are desirable. Redundant links can be important as backups in the case of a failover in a network. A failure of a primary activates the backup links so that users can continue to utilize the network. Without STP operating on the bridges and switches, such a failure can result in a loop.

Figure 2:
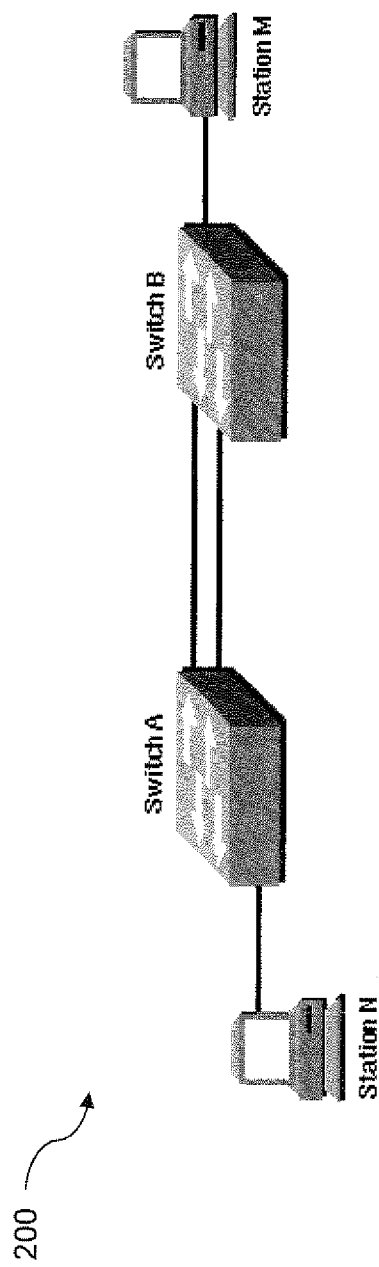
FIG. 2 illustrates is a block diagram of a conventional network in accordance with an exemplary embodiment.

Referring to FIG. 2, a block diagram of a conventional network in accordance with an exemplary embodiment is illustrated. As shown, the network 200 can include a redundant link between Switch A and Switch B. However, this setup can create the possibility of a bridging loop. For example, a broadcast or multicast packet that transmits from Station M and is destined for Station N may continue circulating between both switches.

Figure 3:
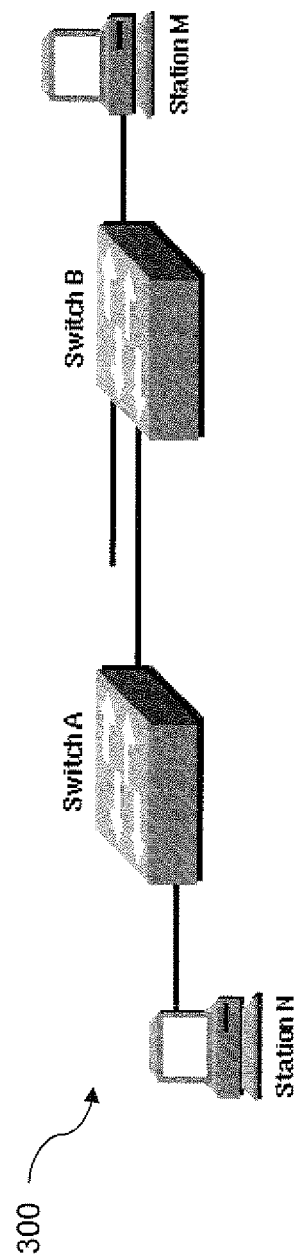
FIG. 3 illustrates a block diagram of the network illustrated in FIG. 2 and implementing STP in accordance with an exemplary embodiment.

Referring to FIG. 3, a block diagram of the network illustrated in FIG. 2 and implementing STP in accordance with an exemplary embodiment is illustrated. As shown, network 300 can have a similar configuration as network 200. However, STP can run on both Switch A and Switch B in the network 300 such that the network 300 operates logically as depicted in FIG. 3, i.e., without a loop condition.

In order to provide desired path redundancy, as well as to avoid a loop condition, STP can define a tree that spans all the switches in an extended network. STP can force certain redundant data paths into a standby (blocked) state and leave other paths in a forwarding state. If a link in the forwarding state becomes unavailable, STP can reconfigure the network and reroutes data paths through the activation of the appropriate standby path. In STP, the switches in a network can elect a root bridge that becomes the focal point in the network. Other decisions in the network, such as which port to block and which port to put in forwarding mode, can also be made from the perspective of this root bridge. A switched environment, which can be different from a bridge environment, may deal with multiple VLANs. When a root bridge is implemented in a switching network, the root bridge can be referred to as the root switch. Each VLAN can be required to have its own root bridge because each VLAN can be a separate broadcast domain. The roots for the different VLANs can all reside in a single switch or in various switches.

The switches in the network can exchange information for use in the root switch selection and for subsequent configuration of the network. Bridge protocol data units (BPDUs) can carry this information. A switch can compare the parameters in the BPDU that the switch sends to a neighbor with the parameters in the BPDU that the switch receives from the neighbor. When the switches first come up, the switches can start the root switch selection process. Each switch can transmit a BPDU to the directly connected switch on a per-VLAN basis. As the BPDU goes out through the network, each switch can compare the BPDU that the switch sends to the BPDU that the switch receives from the neighbors. The switches can then agree on which switch is the root switch. The switch with the lowest bridge ID in the network wins this election process. In other embodiments, other election processes can be employed, e.g., highest bridge ID. After identifying or electing the root switch, the switches generally adhere to these rules:

STP Rule 1—All ports of the root switch are set to forwarding mode. Next, each switch determines the best path to get to the root. The switches determine this path by a comparison of the information in all the BPDUs that the switches receive on all ports. The switch can use the port with the least amount of information in the BPDU in order to get to the root switch. The port with the least amount of information in the BPDU can be the root port. After a switch determines the root port, the switch can proceed to rule 2.

STP Rule 2—The root port is set to forwarding mode. In addition, the switches on each LAN segment can communicate with each other to determine which switch is best to use in order to move data from that segment to the root bridge. This switch can be called the designated switch.

STP Rule 3—In a single LAN segment, the port of the designated switch that connects to that LAN segment is placed in forwarding mode.

STP Rule 4—All the other ports in all the switches (VLAN-specific) are placed in blocking mode. The rule only applies to ports that connect to other bridges or switches. STP does not affect ports that connect to workstations or PCs. These ports can remain forwarded.

STP can calculate the path cost based on the media speed (bandwidth) of the links between switches and the port cost of each port forwarding frame. Spanning tree selects the root port based on the path cost. The port with the lowest path cost to the root bridge can become the root port. The root port is always in the forwarding state. If the speed/duplex of the port is changed, the STP can recalculate the path cost automatically. A change in the path cost can change the spanning tree topology.

As mentioned, data centers are increasingly deploying high port density L2 and L3 switches in their networking infrastructure. Further, many data centers are integrating more and more Virtual Ethernet Port Aggregator (VEPA) devices into their networks. VEPA devices, which enable each switch front panel port to be virtualized, can add many more customer usable physical ports to a system. Consequently, computing resource utilization (e.g., CPU, memory, I/O) for a network infrastructure device will rise proportionally.

One significant contributor to CPU, memory, and I/O utilization on network infrastructure devices can be the processing required by STP. With STP, a network infrastructure device can be required to maintain protocol state information about every enabled VLAN on every port on the device. For example, the device may need to maintain such information to determine per VLAN and/or private VLAN (PVLAN) count. Hence, reducing overhead for STP wherever possible without affecting the operation of the protocol can be beneficial to both network operating system software stability and scalability.

One approach for optimizing STP operation is to control the STP type of the port. STP port type can include edge port or network port. Edge ports can be connected directly to hosts. Network ports can be connected to network infrastructure devices. Edge ports may not need the full STP state machine required by network ports. For example, each host-facing port in a network infrastructure device with a large number of edge ports can be set to STP edge mode, wherein the protocol operation can be pruned back and the port can be placed in a forwarding state without running through the entire protocol state machine. The periodic BPDUs transmitted during operation of STP may not be sent on edge ports, further reducing resource utilization on the system. In other embodiments, the periodic BPDUs transmitted during operation of STP may be extended: increasing the time between transmissions.

In certain conventional approaches, the ports of network infrastructure devices can be configured manually by a network administrator. However, with the deployment of high port density network infrastructure devices and VEPA appliances in data centers, the number of ports in the data centers has risen significantly. To the extent manual configuration of STP port type is feasible; manually configuring the port type can be inefficient and error-prone. Another conventional approach assumes that ports residing on VEPA appliances are likely to be connected to end hosts, and all ports on such devices can be configured as edge ports. In certain situations, however, ports on VEPA appliances can be connected to networking infrastructure devices such that a putative edge port may actually be attached to a device that is not an end host. This can cause loops in the network and result in network instability.

Systems and approaches in accordance with various embodiments may overcome one or more of the aforementioned and other deficiencies experienced in conventional approaches for operating STP by employing a mechanism wherein the STP port type (e.g., edge or network) can be dynamically configured based on a neighbor discovery trigger. In various embodiments, network infrastructure devices are configured to run a protocol for discovering network device capabilities, such as Link Level Discovery Protocol (LLDP) or Cisco Discovery Protocol (CDP), for example. For example, LLDP can be used by the network infrastructure devices to exchange system capabilities (e.g., System Capabilities TLV type is 7 in LLDP) to identify whether the link level peer is a host device or a network device. The system capability TLV exchange can serve as a trigger to configure the STP port as a network port for a port connected to a switch, bridge, relay, components thereof, among other network infrastructure devices (e.g., LLDP capability values 3, 9, 10, and/or 11), or an edge port for a port connected to an end host (e.g., LLDP capability value 8).

LLDP is standardized as IEEE 802.1AB, entitled "Station and Media Access Control Connectivity Discovery", and which is incorporated herein by reference. LLDP is a link layer protocol that allows an IEEE 802 LAN station to report the capabilities and current status of the system associated with a MAC service access point (MSAP). The MSAP can provide the MAC service to a logical link control (LLC) entity, and that LLC entity can provide a link service access point (LSAP) to an LLDP agent that transmits and receives information to and from the LLDP agents of other stations attached to the same LAN. The information can be distributed and received in each LLDP data unit (LLDPDU) and can be stored in one or more Management Information Bases (MIBs).

The information fields in each LLDP frame are contained in an LLDPDU as a sequence of variable length information elements, that each include "type," "length," and "value" fields (known as TLVs), where type identifies what kind of information is being sent, length indicates the length of the information string in octets, and value is the actual information that needs to be sent (for example, a binary bit map or an alphanumeric string that can contain one or more fields).

Figure 4:
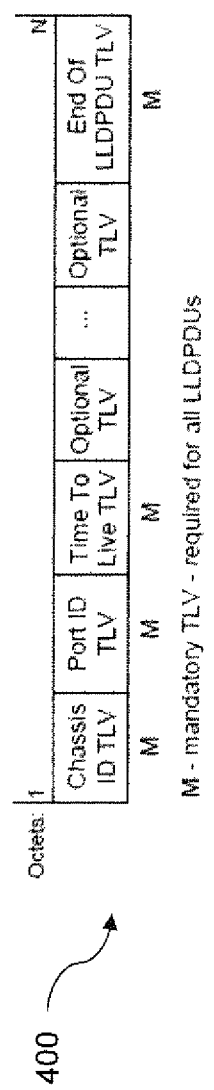
FIG. 4 illustrates a block diagram of a Link Level Discovery Protocol Data Unit (LLDPDU) in accordance with an exemplary embodiment.

Each LLDPDU can contain four mandatory TLVs, including a chassis ID TLV, port ID TLV, time to live (TTL) TLV, and end of LLDPU TLV. An LLDPU can also contain zero or more optional TLVs, as allowed by the maximum size of the LLDPU, and as selected by network management. FIG. 4 illustrates an example of an LLDPDU 400 that can be used in various embodiments. The chassis ID and the port ID values can be concatenated to form a logical MSAP identifier that is used by the recipient to identify the sending LLDP agent/port. Both the chassis ID and port ID values can be defined in a number of convenient forms. Once selected, however, the chassis ID/port ID value combination remains the same as long as the particular port remains operable.

A non-zero value in the TTL field of the TTL TLV can tell the receiving LLDP agent how long all information pertaining to this LLDPDU's MSAP identifier is valid so that all the associated information can later be automatically discarded by the receiving LLDP agent if the sender fails to update it in a timely manner. A zero value can indicate that any information pertaining to this LLDPDU's MSAP identifier is to be discarded immediately. The end of LLDPDU TLV can mark the end of the LLDPDU.

The maximum length of the LLDPDU is the maximum information field length allowed by the particular transmission rate and protocol. In IEEE 802.3 MACs, for example, the maximum LLDPDU length is the maximum data field length for the basic, untagged MAC frame (e.g., 1500 octets).

As mentioned, TLVs are generally grouped as mandatory TLVs and optional TLVs. Mandatory TLVs can be considered to be basic to the management of network stations and that are a required capability of all LLDP implementations. Each TLV in this category can be identified by a unique TLV type value that indicates the particular kind of information contained in the TLV. Optional TLVs can include organizationally specific extension sets of TLVs that are defined by standards groups such as IEEE 802.1 and IEEE 802.3 and others to enhance management of network stations that are operating with particular media and/or protocols. TLVs in this category can be identified by a common TLV type value that indicates the TLV as belonging to the set of organizationally specific TLVs. Each organization can be identified by an organizationally unique identifier (OUI). Organizationally specific TLV subtype values can indicate the kind of information contained in the TLV.

Figure 5:
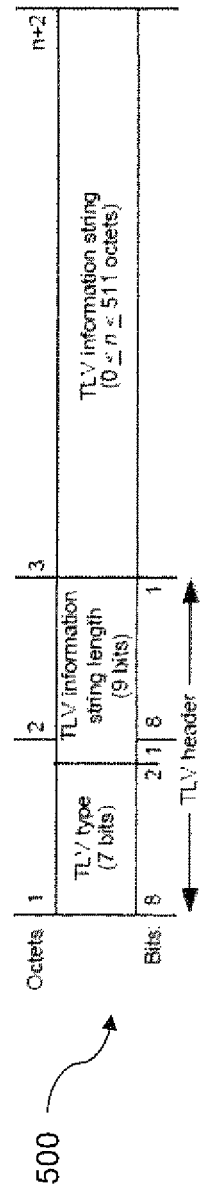
FIG. 5 illustrates a block diagram of a Type Length Value (TLV) field of an LLDPDU in accordance with an exemplary embodiment.

FIG. 5 illustrates a TLV field of an LLDPDU in accordance with an exemplary embodiment. The TLV field 500 can include a TLV type field that occupies the seven most significant bits of the first octet of the TLV format. The least significant bit in the first octet of the TLV format is the most significant bit of the TLV information string length field. Table 1 lists the currently defined TLVs, their identifying TLV type values, and whether they are mandatory or optional for inclusion in any particular LLDPDU.

TABLE 1

| TLV type | TLV name | Usage in LLDPDU |
| --- | --- | --- |
| 0 | End Of LLDPDU | Mandatory |
| 1 | Chassis ID | Mandatory |
| 2 | Port ID | Mandatory |
| 3 | Time To Live | Mandatory |
| 4 | Port Description | Optional |
| 5 | System Name | Optional |
| 6 | System Description | Optional |
| 7 | System Capabilities | Optional |
| 8 | Management Address | Optional |
| 9-126 | Reserved for future standardization | — |
| 127 | Organizationally Specific TLVs | Optional |

The TLV information string length field can contain the length of the information string, in octets. The TLV information string can be fixed or variable length, and can include one or more information fields with associated subtype identifiers and field length Designators. The information string can also contain either binary or alpha-numeric information that is instance specific for the particular TLV type and/or subtype.

Figure 6:
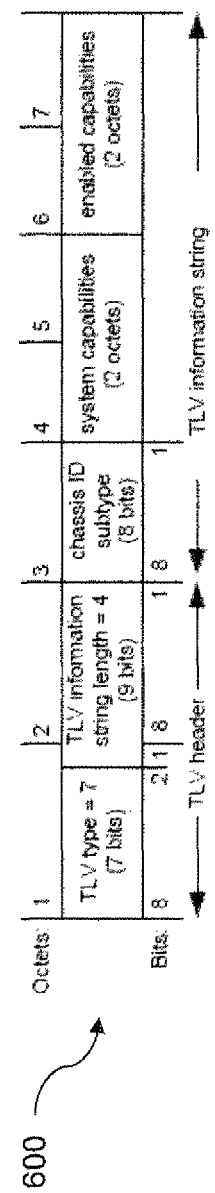
FIG. 6 illustrates a block diagram of a System Capabilities TLV of an LLDPDU in accordance with an exemplary embodiment.

The System Capabilities TLV, TLV type 7, can be an optional TLV that identifies the primary function(s) of the system and whether or not these primary functions are enabled. FIG. 6 illustrates an example of a System Capabilities TLV 600 that can be used in various embodiments.

The system capabilities field contains a bit-map of the capabilities that define the primary function(s) of the system. The bit positions for each function and the associated Management Information Base (MIB) or standard that may be supported are listed in Table 2.

TABLE 2

| Bit | Capability | Reference |
| --- | --- | --- |
| 1 | Other | — |
| 2 | Repeater | IETF RFC 2108 |
| 3 | MAC Bridge | IEEE Std 802.1D |
| 4 | WLAN Access Point | IEEE Std 802.11 MIB |
| 5 | Router | IETF RFC 1812 |
| 6 | Telephone | IETF RFC 4293 |
| 7 | DOCSIS cable device | IETF RFC 4639 and IETF RFC 4546 |
| 8 | Station Only | IETF RFC 4293 |
| 9 | C-VLAN Component of a VLAN Bridge | IEEE Std 802.1Q |
| 10 | S-VLAN Component of a VLAN Bridge | IEEE Std 802.1Q |
| 11 | Two-port MAC Relay (TPMR) | IEEE Std 802.1Q |
| 12-16 | reserved | — |

A binary one in the associated bit indicates the existence of that capability. Individual systems may indicate more than one implemented functional capability (for example, both a bridge and router capability). As mentioned, the system capability TLV exchange can serve as a trigger to configure the STP port type as a network port for bridges, switches, relays, among other infrastructure devices (e.g., LLDP capability values 3, 9, 10, and/or 11), or an edge port for end hosts (e.g., LLDP capability value 8).

In various embodiments, the LLDP operation can be enabled on all devices of a network. Further, LLDP running on the devices of the network can be configured to support the System Capabilities TLV since the capability TLV exchange is optional.

While STP port type setting is one of the parameters available to control STP behavior on a port, further optimization can also be implemented. For example, STP implementation for the Cisco® Nexus 2000 HIF significantly reduces the number of BPDU packets that are sent on a link after the port transitions to forwarding. That is, once the configuration trigger is available, more optimizations can be done on the basis of the capabilities of the link level peer. In addition, a STP port that is placed in forwarding mode, can be placed in portfast mode which causes the port to enter the forwarding state almost immediately. By using portfast mode, the port can reduce the time of listening and learning states which can allow a server or workstation to come online faster.

Moreover, when setting a port in a blocking state, the port can be set to block all traffic. However, in some embodiments, the port can be set to a blocking mode with one or more exemptions for certain types of traffic. For example, a port can be set to block all traffic but allow STP traffic and/or LLDP traffic. This way, the port can become aware if a change is made in the network such that the port should be set from one port type to another.

In various embodiments, every type of port is supported rather than just ports hosted on a VEPA device. In some embodiments, no assumption is made about the attached device. In this manner, loops can be prevented so long as the LLDP stack implementing system capability TLV exchange is enabled on all data center devices.

Figure 7:
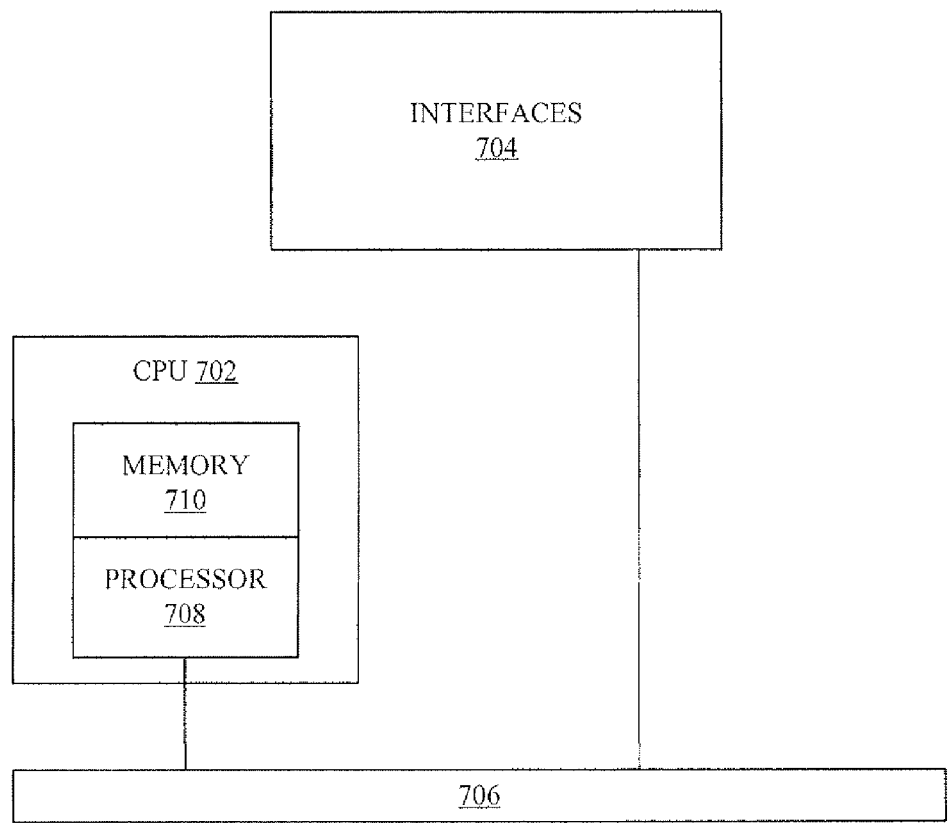
FIG. 7 illustrates a network device in accordance with an exemplary embodiment.

Referring to FIG. 7, a network device suitable for implementing the STP optimization technique in accordance with an exemplary embodiment is illustrated. The network device 700 can include a master central processing unit (CPU) 702, interfaces 704, and a bus 706 (e.g., a PCI bus). When acting under the control of appropriate software or firmware, the CPU 702 can be responsible for operating STP. It preferably accomplishes all these functions under the control of software including an operating system and any appropriate applications software. CPU 702 may include one or more processors 708 such as a processor from the Motorola family of microprocessors or the MIPS family of microprocessors. In an alternative embodiment, processor 708 can be specially designed hardware for controlling the operations of network device 700. In a specific embodiment, a memory 710 (such as non-volatile RAM and/or ROM) also forms part of CPU 702. However, there are many different ways in which memory could be coupled to the system.

The interfaces 704 are typically provided as interface cards (sometimes referred to as "line cards"). Generally, they control the sending and receiving of data packets over the network and sometimes support other peripherals used with the network device 700. Among the interfaces that may be provided are Ethernet interfaces, frame relay interfaces, cable interfaces, DSL interfaces, token ring interfaces, and the like. In addition, various very high-speed interfaces may be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces can include ports appropriate for communication with the appropriate media. In some cases, they may also include an independent processor and, in some instances, volatile RAM. The independent processors may control such communications intensive tasks as packet switching, media control and management. By providing separate processors for the communications intensive tasks, these interfaces allow the master microprocessor 702 to efficiently perform routing computations, network diagnostics, security functions, etc.

Although the system shown in FIG. 7 is one specific network device of the present invention, it is by no means the only network device architecture on which the present invention can be implemented. For example, an architecture having a single processor that handles communications as well as routing computations, etc. is often used. Further, other types of interfaces and media could also be used with the network device.

Regardless of the network device's configuration, it may employ one or more memories or memory modules (including memory 710) configured to store program instructions for the general-purpose network operations and mechanisms for roaming, route optimization and routing functions described herein. The program instructions may control the operation of an operating system and/or one or more applications, for example. The memory or memories may also be configured to store tables such as mobility binding, registration, and association tables, etc.

Figure 8B:
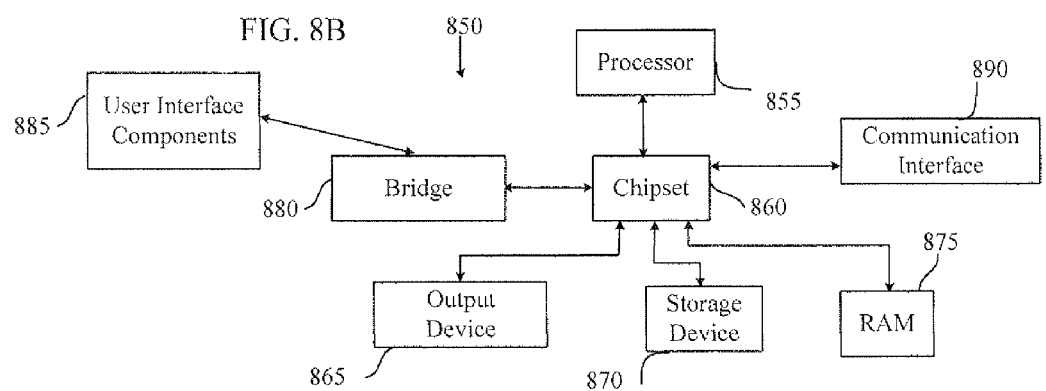
FIG. 8B illustrates a block diagram of a computer system having a chipset architecture that can be used in executing the described method in accordance with an exemplary embodiment.
Figure 8A:
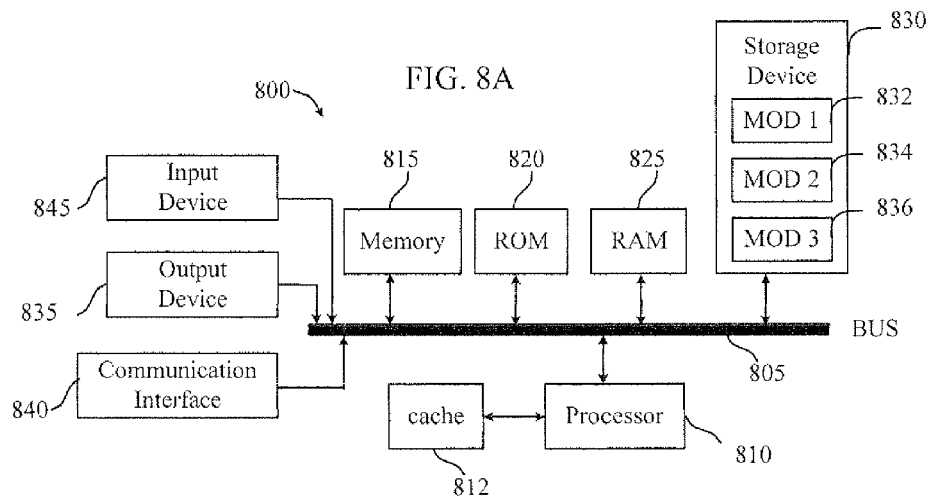
FIG. 8A illustrates a block diagram of a network device in accordance with an exemplary embodiment.

Referring to FIG. 8A, a block diagram of a network device in accordance with an exemplary embodiment is illustrated. A more appropriate embodiment will be apparent to those of ordinary skill in the art when practicing the present technology. Persons of ordinary skill in the art will also readily appreciate that other system embodiments are possible. FIG. 8A illustrates a conventional system bus computing system architecture 800 wherein the components of the system are in electrical communication with each other using a bus 805. Exemplary system 800 includes a processing unit (CPU or processor) 810 and a system bus 805 that couples various system components including the system memory 815, such as read only memory (ROM) 820 and random access memory (RAM) 825, to the processor 810. The system 800 can include a cache of high-speed memory connected directly with, in close proximity to, or integrated as part of the processor 810. The system 800 can copy data from the memory 815 and/or the storage device 830 to the cache 812 for quick access by the processor 810. In this way, the cache can provide a performance boost that avoids processor 810 delays while waiting for data. These and other modules can control or be configured to control the processor 810 to perform various actions. Other system memory 815 may be available for use as well. The memory 815 can include multiple different types of memory with different performance characteristics. The processor 810 can include any general purpose processor and a hardware module or software module, such as a first module 832, a second module 834, and a third module 836 stored in storage device 830, configured to control the processor 810 as well as a special-purpose processor where software instructions are incorporated into the actual processor design. The processor 810 may essentially be a completely self-contained computing system, containing multiple cores or processors, a bus, memory controller, cache, etc. A multi-core processor may be symmetric or asymmetric.

The communications interface 840 can generally govern and manage the user input and system output. There is no restriction on operating on any particular hardware arrangement and therefore the basic features here may easily be substituted for improved hardware or firmware arrangements as they are developed.

Storage device 830 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 825, read only memory (ROM) 820, and hybrids thereof.

The storage device 830 can include software modules 832, 834, 836 for controlling the processor 810. Other hardware or software modules are contemplated. The storage device 830 can be connected to the system bus 805. In one aspect, a hardware module that performs a particular function can include the software component stored in a computer-readable medium in connection with the necessary hardware components, such as the processor 810, bus 805, display 835, and so forth, to carry out the function.

Referring to FIG. 8B, a block diagram of a computer system having a chipset architecture that can be used in executing the described method and generating and displaying a graphical user interface (GUI). The computer system 850 is an example of computer hardware, software, and firmware that can be used to implement the disclosed technology. The computer system 850 can include a processor 855, representative of any number of physically and/or logically distinct resources capable of executing software, firmware, and hardware configured to perform identified computations. The processor 855 can communicate with a chipset 860 that can control input to and output from the processor 855. In this example, the chipset 860 outputs information to output 865, such as a display, and can read and write information to a storage device 870, which can include magnetic media, and solid state media, for example. The chipset 860 can also read data from and write data to RAM 875. A bridge 880 for interfacing with a variety of user interface components 885 can be provided for interfacing with the chipset 860. Such user interface components 885 can include a keyboard, a microphone, touch detection and processing circuitry, a pointing device, such as a mouse, and so on. In general, inputs to the computer system 850 can come from any of a variety of sources, machine generated and/or human generated.

The chipset 860 can also interface with one or more communication interfaces 290 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by the processor 855 analyzing data stored in storage 870 or 875. Further, the machine can receive inputs from a user via user interface components 885 and execute appropriate functions, such as browsing functions by interpreting these inputs using the processor 855.

It can be appreciated that exemplary systems 800 and 850 can have more than one processor 810 or be part of a group or cluster of computing devices networked together to provide greater processing capability.

Referring to FIG. 9, a flowchart for executing an optimized STP configuration in accordance with an exemplary embodiment is illustrated. The exemplary method 900 is provided by way of example, as there are a variety of ways to carry out the method. The method 900 described below can be carried out using the configurations illustrated in FIGS. 1, 8A and 8B by way of example, and various elements of these figures are referenced in explaining exemplary method 900. Each block shown in FIG. 9 represents one or more processes, methods or subroutines, carried out in the exemplary method 900. The exemplary method 900 can begin at block 902.

At block 902, system capabilities information from a link lever peer is received. For example, a network infrastructure device 700, 800 can receive system capabilities information from a link level peer that is a direct neighbor. The information can be received via a port of the network infrastructure device 700, 800. The system capability information can be received via a protocol for discovering network device capabilities, such as LLDP. In order for a device to provide the system capability information via LLDP, the LLDP operation and TLV exchange needs to be activated on each device in the network. For example, an operator can enable the LLSP operation and TLV exchange when each device in the network when each device is installed. After receiving system capabilities information, the method 900 can proceed to block 904.

At block 904, a device type of link level peer is determined. For example, a network infrastructure device 700, 800 can determine the device type of the link level peer based on the received system capabilities information from the link level peer. For example, using the system capabilities information shown in Table 2, the network infrastructure device 700, 800 can determine if the neighbor device is a network port (e.g., LLDP capability values 3, 9, 10, and/or 11) or an edge port for end hosts (e.g., LLDP capability value 8). After determining the device type, the method 900 can proceed to block 906.

At block 906, a STP port type is configured for the port based on the determined device type. For example, a network infrastructure device 700, 800 can configure the STP port type of the port based on the determined device type. For example, the STP port type can be set to a network port if the device type is one of, a Media Access Control (MAC) bridge, a Customer Virtual Local Area Network (C-VLAN) component of a VLAN bridge, a Service VLAN (S-VLAN) of a VLAN Bridge, or a Two-port MAC Relay (TPMR). The STP port can be set to an edge port based on the determined type being an end station. For ports that are configured as edge ports, the edge ports can be placed in a forwarding state or a portfast state without running through the entire STP state machine. In addition, the periodic BDPUs can be reduced and/or eliminated to reduce the resource utilization on the system.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. A computer implemented method by one or more processors of a network infrastructure device, comprising:
   receiving system capabilities information from a link level peer at a port of the network infrastructure device, wherein the system capabilities information identifies whether the link level peer is a host or a network infrastructure device;
   determining a device type of the link level peer based on the system capabilities information; and
   automatically configuring a Spanning Tree Protocol (STP) port type for the port based on the device type of the link level peer, triggered in response to receiving the system capabilities information.

2. The computer implemented method of claim 1, wherein the system capabilities information is received via a Link Level Discovery Protocol (LLDP).

3. The computer implemented method of claim 1, wherein configuring the STP port type for the port includes:
   setting the STP port type for the port to a network port in response to determining that the device type of the link level peer comprises one of a Media Access Control (MAC) bridge, a Customer Virtual Local Area Network (C-VLAN) component of a VLAN bridge, Service VLAN (S-VLAN) component of the VLAN bridge, or a Two-port MAC relay (TPMR).

4. The computer implemented method of claim 1, wherein configuring the STP port type for the port includes:

setting the STP port type for the port to an edge port in response to determining that the device type of the link level peer is an end station.

5. The computer implemented method of claim 4, wherein setting the STP port type for the port to an edge port further comprises setting the port to a forwarding state.

6. The computer implemented method of claim 4, wherein setting the STP port type for the port to an edge port further comprises preventing the transmission of Bridge protocol data units (BPDUs) on the edge port.

7. The computer implemented method of claim 4, wherein setting the STP port type for the port to an edge port further comprises setting the port to a portfast state.

8. A system comprising:
a processor; and
a computer-readable storage medium having stored therein instructions which, when executed by the processor, result in an operation further comprising:
receiving system capabilities information from a link level peer at a port of a network infrastructure device, wherein the system capabilities information identifies whether the link level peer is a host or a network infrastructure device;
determining a device type of the link level peer based on the system capabilities information; and
automatically configuring a Spanning Tree Protocol (STP) port type for the port based on the device type of the link level peer, triggered in response to receiving the system capabilities information.

9. The system of claim 8, wherein the system capabilities information is received via a Link Level Discovery Protocol (LLDP).

10. The system of claim 8, wherein configuring the STP port type for the port includes:
setting the STP port type for the port to a network port in response to determining that the device type of the link level peer comprises one of a Media Access Control (MAC) bridge, a Customer Virtual Local Area Network (C-VLAN) component of a VLAN bridge, Service VLAN (S-VLAN) component of the VLAN bridge, or a Two-port MAC relay (TPMR).

11. The system of claim 8, wherein configuring the STP port type for the port includes:
setting the STP port type for the port to an edge port in response to determining that the device type of the link level peer is an end station.

12. The system of claim 11, wherein setting the STP port type for the port to an edge port further comprises setting the port to a forwarding state.

13. The system of claim 11, wherein setting the STP port type for the port to an edge port further comprises preventing the transmission of Bridge protocol data units (BPDUs) on the edge port.

14. The system of claim 11, wherein setting the STP port type for the port to an edge port further comprises setting the port to a portfast state.

15. A non-transitory computer-readable storage medium having stored therein instructions which, when executed by a processor, cause the processor to perform operations comprising:
receiving system capabilities information from a link level peer at a port of a network infrastructure device, wherein the system capabilities information identifies whether the link level peer is a host or a network infrastructure device;
determining a device type of the link level peer based on the system capabilities information; and
automatically configuring a Spanning Tree Protocol (STP) port type for the port based on the device type of the link level peer, triggered in response to receiving the system capabilities information.

16. The non-transitory computer-readable storage medium of claim 15, wherein the system capabilities information is received via a Link Level Discovery Protocol (LLDP).

17. The non-transitory computer-readable storage medium of claim 15, wherein configuring the STP port type for the port includes:
setting the STP port type for the port to a network port in response to determining that the device type of the link level peer comprises one of a Media Access Control (MAC) bridge, a Customer Virtual Local Area Network (C-VLAN) component of a VLAN bridge, Service VLAN (S-VLAN) component of the VLAN bridge, or a Two-port MAC relay (TPMR).

18. The non-transitory computer-readable storage medium of claim 15, wherein configuring the STP port type for the port includes:
setting the STP port type for the port to an edge port in response to determining that the device type of the link level peer is an end station.

19. The non-transitory computer-readable storage medium of claim 18, wherein setting the STP port type for the port to an edge port further comprises setting the port to a forwarding state.

20. The non-transitory computer-readable storage medium of claim 18, wherein setting the STP port type for the port to an edge port further comprises setting the port to a portfast state.

* * * * *